United States Patent [19]
Iovdalsky et al.

[11] Patent Number: 6,057,599
[45] Date of Patent: May 2, 2000

[54] HYBRID HIGH-POWER MICROWAVE-FREQUENCY INTEGRATED CIRCUIT

[75] Inventors: Viktor Anatolievich Iovdalsky; Eduard Volfovich Aizenberg; Vladimir Iliich Beil, all of Moskovskaya, Russian Federation

[73] Assignee: Samsung Electronics Co., Ltd., Rep. of Korea

[21] Appl. No.: 09/077,630

[22] PCT Filed: Sep. 26, 1996

[86] PCT No.: PCT/RU96/00276

§ 371 Date: May 26, 1998

§ 102(e) Date: May 26, 1998

[87] PCT Pub. No.: WO98/13874

PCT Pub. Date: Apr. 2, 1998

[51] Int. Cl.[7] .................................................. H01L 23/34
[52] U.S. Cl. ........................... 257/728; 257/708; 257/691
[58] Field of Search .................................... 257/728, 708, 257/691; 333/247

[56] References Cited

U.S. PATENT DOCUMENTS

| | | | |
|---|---|---|---|
| 5,073,814 | 12/1991 | Cole et al. | 257/643 |
| 5,331,203 | 7/1994 | Wojnarowski et al. | 257/698 |
| 5,559,363 | 9/1996 | Immorlica, Jr. | 257/664 |

*Primary Examiner*—Teresa M. Arroyo
*Attorney, Agent, or Firm*—Piper Marbury Rudnick & Wolfe

[57] ABSTRACT

In a power microwave hybrid integrated circuit, a recess (10) is formed on the back side of a board (5) under a projection (2) of a base (1), the recess (10) having holes (11) of a definite size in the bottom thereof, while the upper portion of the projection (2) of the base (1) not occupied with a chip (3) is electrically connected to the bottom of the recess (10), a grounding of a portion of bonding pads (4) of the chip (3) being performed through the holes (11) in the bottom of the recess (10), the spacing between the chip (3) and the walls of a hole (8) for mounting the chip (3) being less than 150 μm and the grounding hole (11) being less than 150 μm.

4 Claims, 3 Drawing Sheets

HYBRID HIGH-POWER MICROWAVE-FREQUENCY INTEGRATED CIRCUIT

FIELD OF THE INVENTION

The present invention relates in general to electronic engineering and more specifically to a power microwave hybrid integrated circuit.

BACKGROUND OF THE INVENTION

A microwave hybrid integrated circuit is known, in which circuit a dielectric board having a topological metallization pattern on its face side and a shield grounding metallization on the back side thereof is secured on a metal base having a projection which is placed in the hole of the board and has a supporting pad in its upper portion, on which pad a semiconducter chip is placed. The ground contact is shaped as the rectangular portion of the base projection, the upper portion of the ground contact on the base projection and the face surface of the chip are coplanar with the face surface of the board. Chip bonding pads located on the side having the metal grounding projection are electrically connected, through said projection to the topological metallization pattern (cf. "Transistorized amplifier", No. M42213, 6III2030295ТУ, Var. 2–89, TC2.030.1 50СБ, 1989).

The aforecited microwave hybrid integrated circuit is possessed of low electrical and weight-size characteristics, and also of a manufacturing complexity associated with a need to make precisely the projection on the base and the hole in the board.

Another microwave hybrid integrated circuit is known, in which circuit a dielectric board having a topological metallization pattern on its face side and a shield grounding metallization on the back side thereof is also secured on a metal base having a projection which is also placed in the hole of the board and has a supporting pad in its upper portion, om which pad a semiconducter chip is placed. The projection has two ground contacts shaped as metal parallelepipeds situated on two opposite chip sides and arranged in the same plane with the chip face surface and the board face surface. The transistor terminals (the source and drain ones) are situated on two opposite sides and are electrically connected to the board topological metallization pattern, while the transistor gates are interconnected and electrically connected to the ground contacts of the metal projection, which made it possible to reduce the terminal length and thereby to enhance the circuit characteristics, though inadequately ((cf. "Transistorized amplifier", No.M42213, 6III2030295 ТУ, Var. 2–89, АРПГ434815.005СБ, 1989).

The above integrated circuit is possessed of low electrical and weight-size characteristics, and also of a manufacturing complexity associated with a need make the projection on the base and the hole in the board.

SUMMARY OF THE INVENTION

The principal object of the present invention is to provide a power microwave hybrid integrated circuit having such a constructive arrangement that would allow to enhance electrical and weight-size characteristics of the circuit and to raise its manufacturability.

The foregoing object is accomplished due to the fact that in a power microwave hybrid integrated circuit, comprising an electrically and heat conducting metal base with a projection, on which a naked semiconductor chip having bonding pads is mounted and fixed, a dielectric board situated on the base and having a topological metallization pattern on its face side and a shield grounding metallization on the back side, and a hole, the chip-carrying projection being arranged in the board hole so that the chip face surface plane is coplanar with the board face surface, a portion of the chip bonding pads are electrically connected to signal conductors of the topological metallization pattern, while another portion of the chip bonding pads are grounded by an electrical connection with the metal base projection, according to the present invention, a recess is formed on the board back side above the base projection, the length and width of said recess exceeding those of the projection by 0.1–1.0 mm, the bottom of said recess having holes 0.1–0.5 mm in diameter, or equivalent in area rectangular metallized holes at least partially filled with an electrically and heat conducting material, the upper portion of the base projection not occupied by the chip being electrically connected to the bottom of the recess, the grounding of the portion of the chip bonding pads being performed through the holes in the bottom of the recess, the spacing between the chip and the walls of the hole accommodating the chip being less than 150 $\mu$m and the spacing between the hole for the chip and the grounding holes being less than 150 $\mu$m.

A frame-shaped projection may be made at the edges of the metal base, and a frame-shaped groove may also be made on the back side of the board at the edges thereof, said frame-shaped projection may be located in said frame-shaped groove and joined sealingly with the bottom of the groove, the thickness of the board in the groove being equal to the thickness of the recess bottom, the spacing between the side surface of the board in the groove and the metal frame-shaped projection is to be equal to half an excess of the recess length and width over the projection length and width.

It is desirable to ground the chip bonding pads along the side of the hole for the chip.

The leads interconnecting the bonding pads to be grounded may be placed between the walls of the hole in the board and the chip side surface and electrically connected to the metal projections under the chip.

The filed power microwave hybrid integrated circuit allows:

first, to reduce the length of the connecting conductors due to a shorter distance between the chip bonding pads and the topological metallization pattern, and between the chip bonding pads and the grounding holes, thereby reducing their spurious inductance and hence improving the circuit electrical parameters;

second, to reduce the area of the ground contact on the board due to substituting for the ground contact of the projection for the grounding hole filled with an electrically conducting material, thereby improving the weight-size characteristics of the circuit;

third, to reduce the requirements imposed upon the manufacturing accuracy of the recess, groove, projection, frame-shaped projection, and location of the hole for chip, as well as those imposed upon assembling accuracy of the board and base too, thus enhancing the manufacturability of the proposed circuit.

BRIEF DESCRIPTION OF THE DRAWINGS

The present invention is further illustrated by a detailed description of some specific exemplary embodiments thereof to be taken with reference to the accompanying drawings, wherein.

BEST METHOD OF CARRYING OUT THE INVENTION

Figure 1:
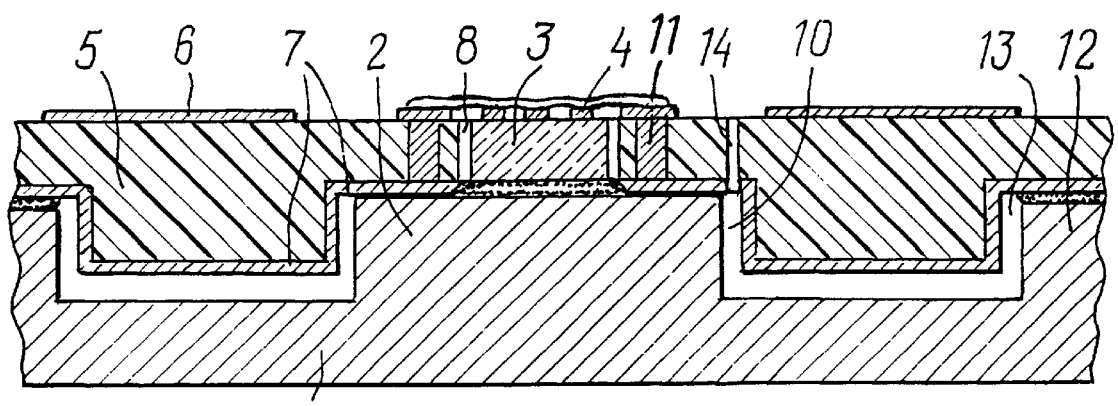
FIG. 1 is a sectional view of the filed power microwave hybrid integrated circuit.
Figure 2:
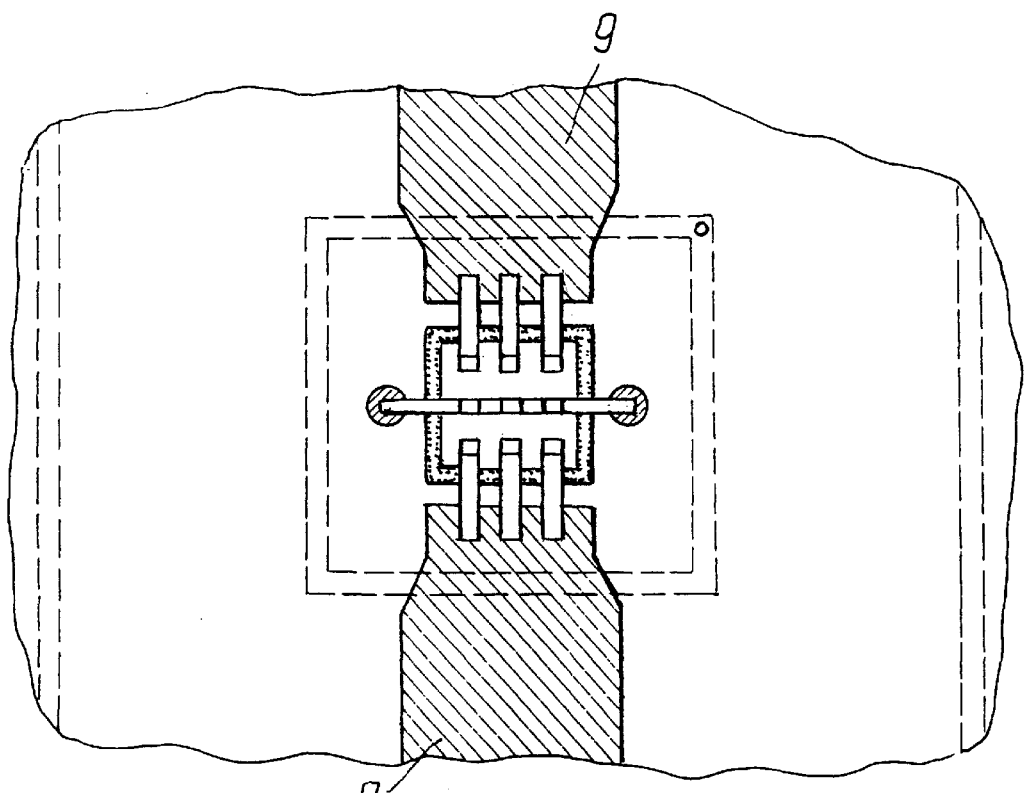
FIG. 2 is a plan view of FIG. 1.

The filed power microwave hybrid integrated circuit comprises an electrically and heat conducting metal base 1 (FIG. 1) having a projection 2 on which a naked semiconductor chip 3 is mounted and fixed, e.g., the 3π603Б-5 transistor 0.5×0.45×0.3 mm in size, said chip having bonding pads 4, a dielectric board 5 made of, e.g., Polycor 30×48×0.5 mm in size, said board being situated on the base 1 and having a topological metallization pattern 6 on its face side and a shield grounding metallization 7 on the back side thereof, said metallization having the following structure: Ti(0.02 μm)—Pd(0.2 μm)—Au(3 μm), and a hole 8, e.g., 0.6×0.55 mm in size. The projection 2 carrying the chip 3 is placed in the hole 8 of the board 5 so that the face surface plane of the chip 3 is coplanar with the face surface plane of the board 5. A portion of the bonding pads 4 of the chip 3 is electrically connected to signal conductors 9 (FIG. 2) of the topological metallization pattern 6, while another part of the bonding pads is grounded by electrical connection with the projection 2 (FIG. 1) of the metal base 1.

A recess 10 is made on the back side of the board 5 above the projection 2 of the base 1, the length and width of said recess exceeding those of the base projection 2 by, e.g., 1 mm, while the depth of the recess 10 is, e.g., 0.2 mm. The length and width of the bottom of the recess 10 exceed those of the projection 2 by 0.5 mm. The upper portion of the projection 2 of the base 1 not occupied by the chip 3, is electrically connected to the bottom of the recess 10, e.g. brazed with the Au—Si hard solder, or joined using the diffusion welding technique. A portion of the bonding pads 4 of the chip 3 are grounded through the hole 11 in the bottom of the recess 10, which hole is filled with an electrically and heat conducting material, e.g., the Au—Si hard solder with which the bottom of the recess 10 is brazed to the projection 2, or the hole 11 may be closed by means of electroplating with, e.g., copper followed by coating it with nickel and gold. The spacing between the chip 3 and the grounding hole 11 is 100 μm, as well as the spacing between the chip 3 and the walls of the hole 8 is 100 μm. A frame-shaped projection 12 having a width and height of e.g., 1 mm and 0.3 mm is made at the edges of the metal base 1, and a frame-shaped groove 13 is made on the back side of the board 5 at the edges thereof, said groove having a width and depth of, e.g., 1.25 mm and 0.2 mm, respectively. The frame-shaped projection 12 is located in the frame-shaped groove 13 and is joined sealingly with the bottom of the groove, using, e.g., the eutectic Au—Si hard solder. The thickness of the board 5 in the groove 13 is equal to the thickness of the bottom of the recess 10. The spacing between the side surface of the board 5 in the groove 13 and the metal frame-shaped projection 12 of the base 1 is equal to half the excess the length and width of the recess 10 over the length and width of the projection 2, that is, 0.25 mm. The space under the board 5 communicates with the space over said board through a pressure balancing hole 14.

The leads interconnecting the bonding pads 4 to be grounded are placed between the walls of the hole 8 in the board 5 and the side surface of the chip 3 and are electrically connected to the metal projections 2 under the chip 3.

Figure 3:
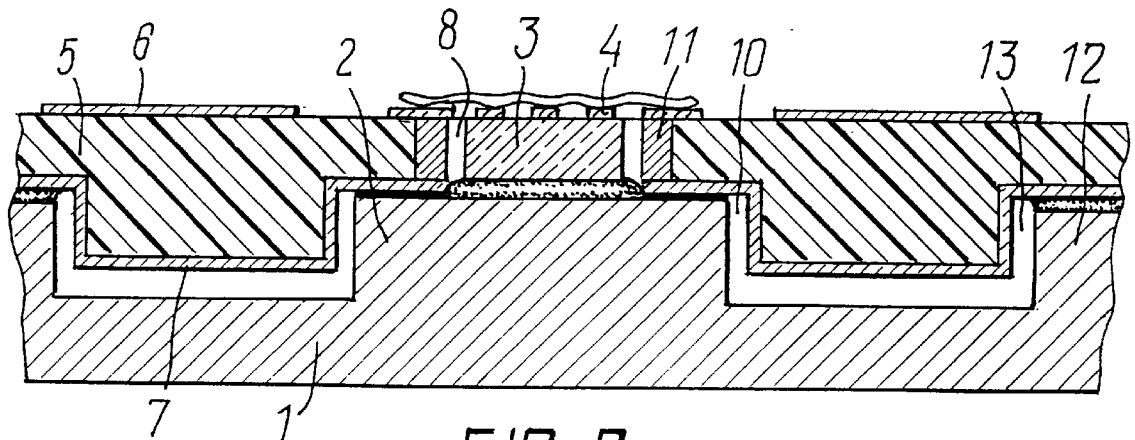
FIG. 3 is a sectional view of another embodiment of the filed power microwave hybrid integrated circuit.
Figure 4:
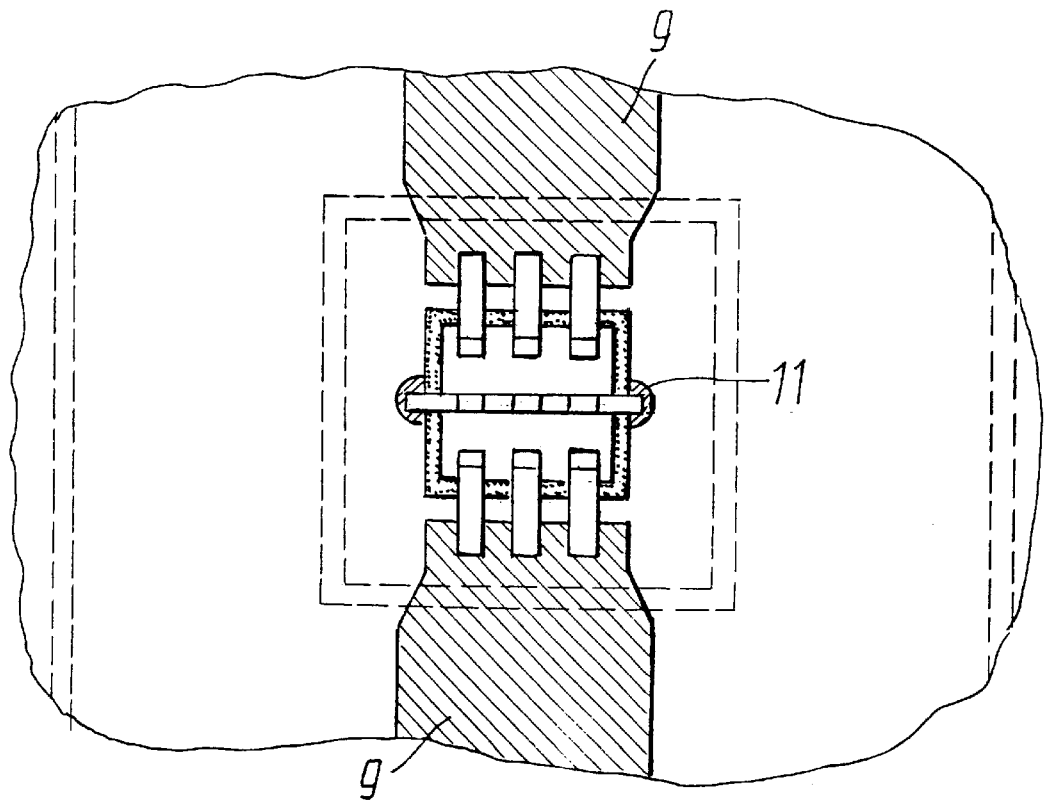
FIG. 4 is a plan view of FIG. 3.

FIGS. 3 and 4 present one more embodiment of the filed circuit, wherein the grounding is effected along the side wall of the hole 8 for the chip 3.

Figure 5:
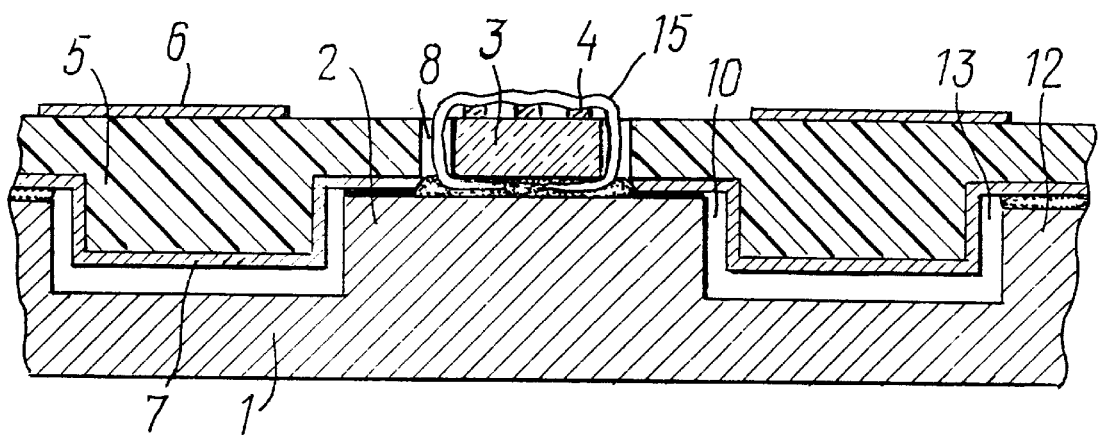
FIG. 5 is a sectional view of still another embodiment of the filed power microwave hybrid integrated circuit.
Figure 6:
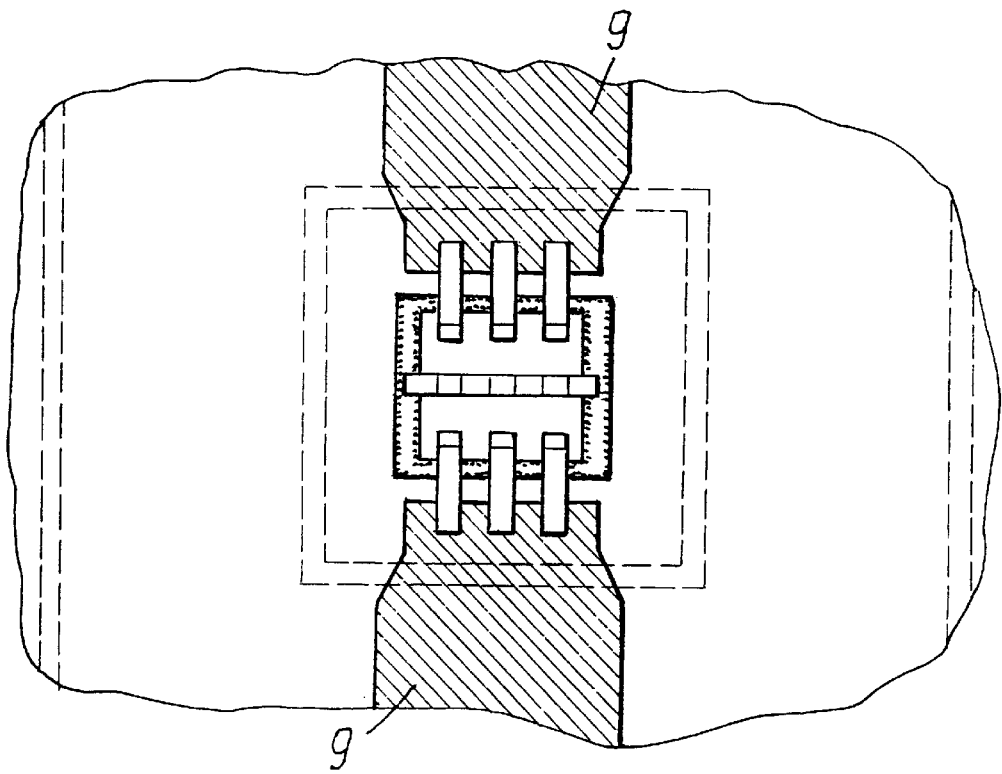
FIG. 6 is a plan view of FIG. 5.

FIGS. 5 and 6 illustrate still one more embodiment of the filed circuit, wherein grounding leads 15 are placed between the walls of the hole 8 in the board 5 and the chip 3 and are electrically connected to the projection 2 of the metal base 1 under the semiconductor chip 4.

Thus the filed power microwave hybrid integrated circuit allows:

first, to reduce the length of the connecting leads and hence their spurious inductance and capacitance, thereby improving the electrical parameters of the circuit;

second, to reduce the area of the ground contact and imparting thereto the shape that provides for better heat dissipation, thereby improving the weight-size characteristics of the circuit;

third, to reduce the requirements imposed upon the manufacturing accuracy of the base and plate, as well as those imposed upon assembling accuracy of the board and base, and of the chip and base too, thus enhancing the manufacturability of the circuit.

Moreover, the frame-shaped gaskets between the base and the board may be eliminated, thus further improving the weight-size characteristics and simplifying the construction of the circuit.

In describing the disclosed embodiments of the present invention, specific narrow terminology is used for the sake of clarity. However, the invention is not restricted to the specific terms so selected, and it should be understood that each such term covers all equivalent elements functioning in a similar way and used for solving similar problems.

Although the present invention has been described herein with reference to the preferred embodiment, it will be understood that various modifications and alterations may occur to the details of construction without departing from the spirit and scope of the invention, as will be readily understood by those skilled in the art.

All these modifications and alterations should be considered to remain within the limits of the spirit and scope of the invention and the claims.

INDUSTRIAL APPLICABILITY

The present invention can be used in semiconductor microelectronics.

We claim:

1. A power microwave hybrid integrated circuit comprising an electrically and heat conducting metal base (1) with a projection (2), on which a naked semiconductor chip (3) having bonding pads (4) is mounted and fixed, a dielectric board (5) situated on the base and having a topological metallization pattern (6) on its face side and a shield grounding metallization (7) on its back side, and a hole (8), the projection (2) carrying the chip (3) being arranged in hole (8) of the board (5) so that a face surface plane of the chip (3) is coplanar with a face surface plane of the board (5), a portion of the bonding pads (4) of the chip (3) are electrically connected to signal conductors (9) of the topological metallization pattern (6), while another portion of the bonding pads (4) are grounded by an electric connection with the projection (2) of the metal base (1), CHARACTERIZED in that a recess (10) is formed on the back side of the board (5) above the projection (2) of the base (1), the length and width of said recess (10) exceeding those of the projection (2) by 0.1–1.0 mm, the bottom of said recess (10) having rectangular metallized holes (11) 0.1–0.5 mm in diameter or equivalent in area at least partially filled with an electrically and heat conducting material, an upper portion of the projection (2) of the base (1) not occupied with the chip (3) being electrically connected to the bottom of the recess (10), the grounding of the portion of the bonding pads (4) of the chip (3) being performed through the holes (11) in the bottom of the recess (10), the spacing between the chip (3) and walls of the hole (8) accomodating the chip (3) being less than 150 μm and the spacing that between the hole (8) for the chip and the grounding holes (11) being less than 150 μm.

2. The power microwave hybrid integrated circuit as set forth in claim 1, wherein a frame-shaped projection (12) is made at edges of the metal base (1), and a frame-shaped groove (13) is made on the back side of the board (5) at edges thereof, the frame-shaped projection (12) is located in the frame-shaped groove (13) and is joined sealingly with the bottom of the groove (13), the thickness of the board (5) in the groove (13) being equal to the thickness of the bottom of the recess (10), the spacing between a side surface of the board (5) in the groove (13) and the metal frame-shaped projection (12) of the base (1) is equal to half an excess of the length and width of the recess (10) over the length and width of the projection (2).

3. The power microwave hybrid integrated circuit as set forth in claim 1 wherein the grounding of the bonding pads (4) of the chip (3) is performed along a side of the hole (8) for the chip (3).

4. The power microwave hybrid integrated circuit as set forth in claim 1 wherein leads (15) interconnecting the grounded bonding pads (4) are placed between walls of the hole (8) in the board (5) and a side surface of the chip (3) and are electrically connected to the metal projections (2) under the chip (3).

* * * * *